US007618891B2

(12) United States Patent
Fang et al.

(10) Patent No.: US 7,618,891 B2
(45) Date of Patent: Nov. 17, 2009

(54) METHOD FOR FORMING SELF-ALIGNED METAL SILICIDE CONTACTS

(75) Inventors: Sunfei Fang, LaGrangeville, NY (US); Randolph F. Knarr, Putnam Valley, NY (US); Mahadevaiyer Krishnan, Hopewell Junction, NY (US); Christian Lavoie, Ossining, NY (US); Renee T. Mo, Briarcliff Manor, NY (US); Balasubramanian Pranatharthiharan, Elmsford, NY (US); Jay W. Strane, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 277 days.

(21) Appl. No.: 11/415,922

(22) Filed: May 1, 2006

(65) Prior Publication Data
US 2007/0254479 A1    Nov. 1, 2007

(51) Int. Cl.
*H01L 21/00* (2006.01)
(52) U.S. Cl. .................. 438/655; 438/635; 438/682; 438/762; 438/769; 438/770; 257/E21.438; 257/E21.476; 257/E29.156
(58) Field of Classification Search ................ 438/630, 438/651, 650, 655–656, 635, 682, 762, 770; 257/E21.438, 476, E29.156
See application file for complete search history.

(56) References Cited

U.S. PATENT DOCUMENTS

| 4,345,969 | A  | * | 8/1982  | James et al. ................. 438/656 |
|-----------|----|----|---------|----------------------------------------|
| 4,561,907 | A  |   | 12/1985 | Raicu                                  |
| 6,531,396 | B1 | * | 3/2003  | Chi et al. .................... 438/682 |
| 6,787,864 | B2 | * | 9/2004  | Paton et al. ................. 257/412 |
| 7,015,126 | B2 |   | 3/2006  | Wu et al.                              |
| 7,335,606 | B2 | * | 2/2008  | Chi et al. .................... 438/762 |
| 2002/0190028 | A1 | | 12/2002 | Srivastava et al.                      |
| 2004/0203229 | A1 | | 10/2004 | Fang et al.                            |
| 2005/0156210 | A1 | * | 7/2005 | Currie et al. ................. 257/288 |
| 2005/0253204 | A1 | * | 11/2005 | Chan et al. .................. 257/412 |
| 2006/0051961 | A1 | | 3/2006  | Cabral, Jr. et al.                     |
| 2009/0004850 | A1 | * | 1/2009  | Ganguli et al. .............. 438/655   |

* cited by examiner

*Primary Examiner*—Michael S Lebentritt
(74) *Attorney, Agent, or Firm*—Scully, Scott, Murphy & Presser, P.C.; Louis J. Percello, Esq.

(57) ABSTRACT

The present invention relates to a method for forming self-aligned metal silicide contacts over at least two silicon-containing semiconductor regions that are spaced apart from each other by an exposed dielectric region. Preferably, each of the self-aligned metal silicide contacts so formed comprises at least nickel silicide and platinum silicide with a substantially smooth surface, and the exposed dielectric region is essentially free of metal and metal silicide. More preferably, the method comprises the steps of nickel or nickel alloy deposition, low-temperature annealing, nickel etching, high-temperature annealing, and aqua regia etching.

22 Claims, 4 Drawing Sheets

METHOD FOR FORMING SELF-ALIGNED METAL SILICIDE CONTACTS

FIELD OF THE INVENTION

The present invention generally relates to a method for forming self-aligned metal silicide contacts for semiconductor devices. More specifically, the present invention relates to a method for forming self-aligned metal silicide contacts for at least two silicon-containing semiconductor regions that are spaced apart from each other by an exposed dielectric region.

BACKGROUND OF THE INVENTION

The technological development of micro-sized semiconductor integrated circuit devices has required improved methods for making conductive contacts to the semiconductor impurity regions. Metal silicides have proven to be excellent contact materials, which can be readily formed in a self-aligned manner by a salicidation process.

Formation of metal silicide contacts through the salicidation process typically involves the steps of depositing a thin metal layer (e.g., less than about 15 nm in thickness) that contains a silicide metal or metal alloy (i.e., a metal or metal alloy that is capable of reacting with silicon to form metal silicide) uniformly over a semiconductor substrate that contains both silicon-containing device regions and dielectric isolation regions, heating the semiconductor substrate to form silicide over the device regions, and then selectively etching away the unreacted metal from the dielectric isolation regions. For successful fabrication of high performance semiconductor devices, the etching should be highly selective, i.e., it removes all unreacted metal or metal alloy from the dielectric isolation regions, without attacking or otherwise damaging the silicide on the device regions.

Nickel or nickel alloy, such as nickel-platinum alloy, have been commonly used as the silicide metal for forming the silicide contacts in the CMOS technology.

Specifically, for forming pure nickel silicide contacts, a rapid thermal annealing (RTA) step is typically employed to convert the deposited thin nickel layer located on the device regions into nickel silicide, followed by a nickel-etching step to remove the unreacted nickel from the dielectric isolation regions. However, residual material, probably nickel silicide, tends to form over the dielectric isolation regions after the RTA step. Such residual material cannot be satisfactorily removed by the etchant(s) used in the nickel-etching step. The presence of residue material on the dielectric isolation region significantly increases the risk of shorting between device regions and reduces the device reliability. This problem becomes more severe as the RTA temperature increases.

Further, for forming silicide contacts that contain nickel silicide as well as one or more other metal silicides, such as platinum silicide and/or rhenium silicide, a nickel alloy layer that contains nickel and one or more additional silicide metals, such as platinum and/or rhenium, is deposited over the semiconductor substrate. An RTA step is also employed to convert nickel and platinum/rhenium into nickel silicide and platinum/rhenium silicide in the device regions, followed by an aqua regia (AR) etching step to remove both the unreacted nickel and platinum/rhenium from the dielectric isolation regions. Similar problem exists due to presence of residual material over the dielectric isolation regions after the RTA step.

Moreover, when the RTA temperature equals or is less than about 400° C., the silicides formed by the RTA is highly susceptible to attacks by the AR etchant, and significant damages to the silicide contacts may result during the AR etching. On the other hand, when the RTA is carried out at a higher temperature (e.g., >600° C.), gross formation of residual material is observed over the dielectric isolation regions.

Figure 1A:
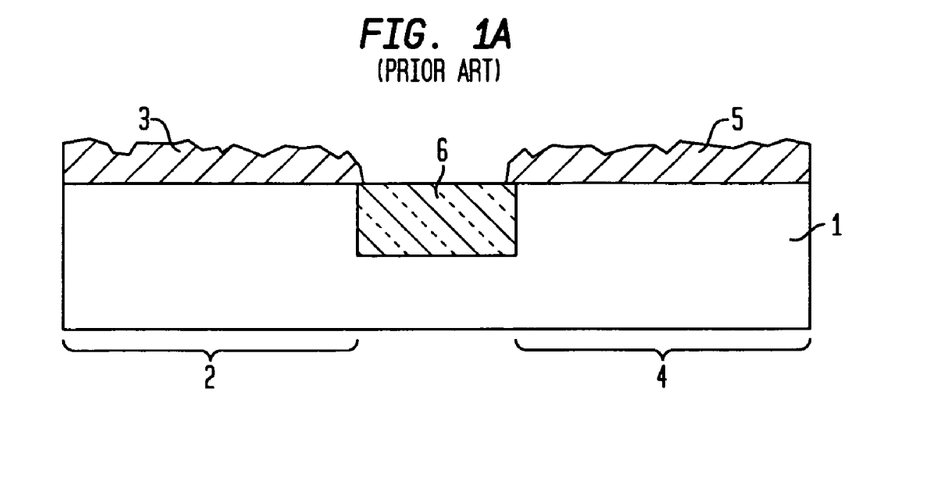
FIGS. 1A and 1B show silicide contacts formed over a semiconductor substrate by conventional RTA/AR etching processes.
Figure 1B:
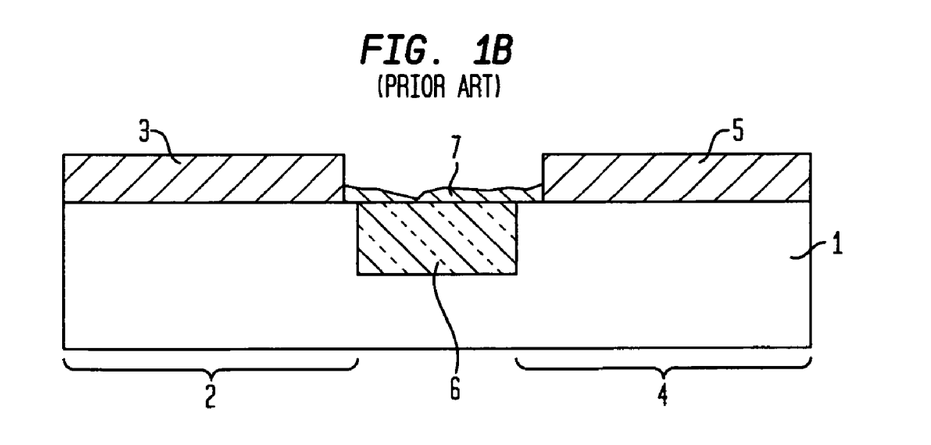

FIGS. 1A and 1B illustrate silicon contacts formed by conventional RTA/AR etching processes. Specifically, silicide contacts 3 and 5, which preferably contain nickel silicide and platinum silicide, are formed over a semiconductor substrate 1 that includes two silicon-containing semiconductor device regions 2 and 4 with a dielectric isolation region 6 therebetween. When the RTA temperature is not high enough, the silicide contacts 3 and 5 will be severely damaged by the AR etching, thereby resulting in a very irregular surface morphology, as shown in FIG. 1A. On the other hand, when the RTA temperature is higher, residual materials (e.g., nickel-platinum-silicide), which are denoted by layer 7, can be formed over the dielectric isolation region 6, as shown in FIG. 1B.

There is therefore a continuing need for an improved method for fabricating the silicide contacts on semiconductor substrates, which is capable of both minimizing the formation of residual materials on the dielectric isolation regions and reducing etching damages to the silicide contacts.

SUMMARY OF THE INVENTION

The present invention provides a method for forming self-aligned metal silicide contacts over at least two silicon-containing semiconductor regions that are spaced apart from each other by an exposed dielectric region. The method of the present invention, on one hand, minimizes deleterious formation of residual materials on the dielectric isolation regions, thereby reducing the risk of shorting between device regions and increasing the device reliability. On the other hand, the method of the present invention reduces damages to the silicide contacts caused by post-anneal etching.

In one aspect, the present invention relates to a method comprising:

forming a metal alloy layer over the silicon-containing semiconductor regions and the exposed dielectric region, wherein the metal alloy layer comprises nickel and at least one additional metal;

annealing at a first annealing temperature ranging from about 150° C. to about 500° C., wherein Ni contained in the metal alloy layer reacts with silicon contained in the semiconductor regions to form nickel silicide of a first phase over the semiconductor regions, selectively etching the metal alloy layer using a first etching solution to remove substantially all un-reacted nickel from the exposed dielectric region between the semiconductor regions;

annealing at a second annealing temperature ranging from about 300° C. to about 600° C., wherein nickel silicide of the first phase further reacts with silicon contained in the semiconductor regions to form nickel silicide of a second phase over the semiconductor region, wherein the second phase has a lower resistivity than the first phase; and selectively etching the metal alloy layer using a second etching solution to remove substantially all remaining un-reacted metal from the exposed dielectric region, thereby forming self-aligned metal silicide contacts that are electrically isolate from each other.

The present invention, in another aspect, relates to a method for etching nickel platinum selective to nickel silicide and platinum silicide, comprising:

providing an etching bath comprising at least one oxidizing agent, at least one complexing agent and at least one solvent;

holding the etching bath at a holding temperature ranging from about 30° C. to about 80° C. for at least 15 minutes;

contacting a work piece that comprises nickel-platinum alloy, nickel silicide, and platinum alloy with the etching bath at an etching temperature ranging from about 30° C. to about 80° C. for a duration of from about 10 to about 45 minutes;

removing the work piece from the etching bath; and rinsing and drying the work piece to remove traces of the etching bath.

In a further aspect, the present invention relates to a semiconductor structure that comprises self-aligned metal silicide contacts located over at least two silicon-containing semiconductor regions, which are spaced apart from each other by an exposed dielectric region. Each of the self-aligned metal silicide contacts comprises at least nickel silicide and platinum silicide and has a substantially smooth surface. Further, the exposed dielectric region is essentially free of metal and metal silicide.

The term "substantially smooth surface" as used herein refers to a surface that contains little or no surface damage and is characterized by surface protrusions and/or recesses of less than 1 nm in height.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides an improved salicidation method for forming self-aligned silicide contacts over device regions contained by a semiconductor substrate, while completely eliminating formation of residual materials over dielectric isolation regions located between the device regions, as well as minimizing the etching damages to the silicide contacts. The resulting structure contains dielectric isolation regions that are essentially free of undesired residual materials (e.g., metal or metal silicide), and the silicide contacts are characterized by a substantially smooth surface.

The exemplary processing steps of the present invention will now be described in greater detail by referring to the accompanying FIGS. 2-7.

Figure 2:
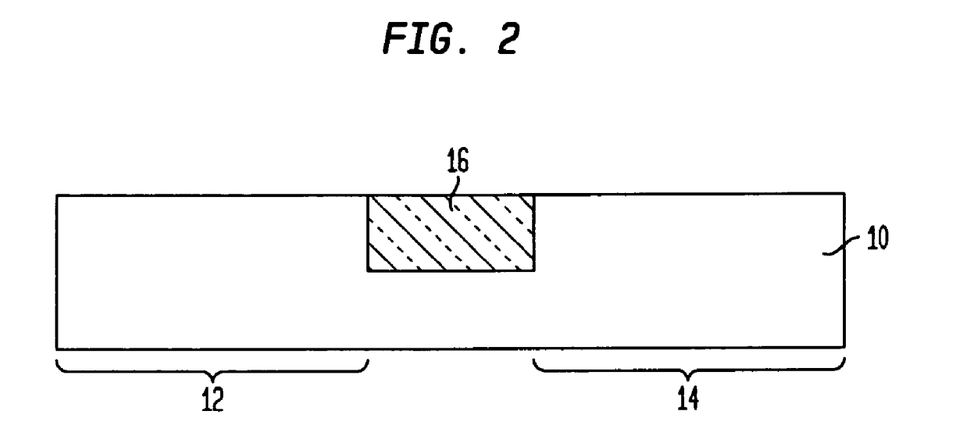
FIGS. 2-7 show exemplary processing steps for forming silicide contacts over a semiconductor substrate, according to one embodiment of the present invention.

Reference is first made to FIG. 2, which shows a semiconductor substrate 10 that contains at least two device regions 12 and 14 that are isolated from each other by a dielectric isolation region 16.

The semiconductor substrate 10 employed in the present invention may comprise any semiconductor material including, but not limited to: undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Semiconductor substrate 10 may also comprise an organic semiconductor or a layered semiconductor such as Si/SiGe, a silicon-on-insulator (SOI) or a SiGe-on-insulator (SGOI).

In preferred embodiments of the present invention, the semiconductor substrate 10 is composed of a Si-containing semiconductor material, i.e., a semiconductor material that includes silicon, such as Si (including undoped Si, n-doped Si, p-doped Si, single crystal Si, polycrystalline Si, and amorphous Si), SiGe, SiGeC, etc. The silicon contained in the semiconductor substrate 10 can react with the silicide metal subsequently deposited to form the silicide contact. On the other hand, it is also contemplated by the present invention that the semiconductor substrate 10 may not comprise silicon, and a patterned silicon-containing layer (not shown) is subsequently formed over the semiconductor substrate 10 to selectively cover the device regions 12 and 14, but not the dielectric isolation region 16. In this manner, the subsequently formed patterned silicon-containing layer provides the required silicon for forming the silicide contacts.

The semiconductor substrate 10 may be doped, undoped or contain both doped and undoped regions therein. These doped regions are known as "wells" and can be used to define various device regions. For example, the device region 12 may represent a first doped (n- or p-) region, and the device region 14 may represent a second doped (p- or n-) region, with either the same or different conductivities and/or doping concentrations. Typically, n-doped regions are used for forming p-channel field effect transistors (p-FETs), and p-doped regions are used for forming n-channel field effect transistors (n-FETs). Therefore, the device regions 12 and 14 may both be n-FET or p-FET device regions, or one of these two regions 12 and 14 is an n-FET region while the other is a p-FET region. In a preferred embodiment of the present invention, one of the device regions 12 and 14 is an n-FET region, and the other is a p-FET region.

In a particularly preferred embodiment of the present invention, the semiconductor substrate 10 is a hybrid substrate, which comprising at least one region (e.g., the n-FET device region) in which mobility of electrons is enhanced, and another region (e.g., the p-FET device region) in which mobility of holes is enhanced. By fabricating the n-FET in the electron-mobility-enhanced region and the p-FET in the hole-mobility-enhanced region, the mobility of the respective charge carriers (i.e., either electrons or holes) in the n-FET and p-FET device regions can simultaneously be enhanced, thereby improving the complementary metal-oxide-semiconductor (CMOS) device performance.

More specifically, the semiconductor substrate 10 is a hybrid substrate that comprises different regions of different crystal orientations (which is referred to herein as a hybrid crystal orientation substrate). Functionality of such hybrid crystal orientation substrates is based on the anisotropy of carrier mobility in the semiconductor crystals. Specifically, the mobility of charged carries such as electrons and holes varies with the crystal orientation of the semiconductor substrate. For example, hole mobility is enhanced for a (110) surface in comparison to a (100) surface in silicon substrate, but electron mobility is enhanced for the (100) silicon surface as compared to the (110) surface. Therefore, by fabricating the n-FET in a device region having the (100) surface crystal orientation, and the p-FET in a different device region having the (110) surface crystal orientation, the mobility of the respective charge carriers (i.e., either electrons or holes) in the n-FET and p-FET device regions are both enhanced.

At least one dielectric isolation region 16 is typically provided in the semiconductor substrate 10 to isolate the adjacent device regions 12 and 14 from each other. The dielectric isolation region 16 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

The device regions 12 and 14 may each comprise a gate stack (not shown) that includes at least a gate dielectric layer, a gate conductor, and optionally one or more sidewall spacers along the sidewalls of the gate conductor. The gate conductor may be a metallic gate conductor, a polysilicon gate conductor, or a gate conductor that comprises both metallic and polysilicon materials, either as a mixture or in separate layers.

Figure 3:
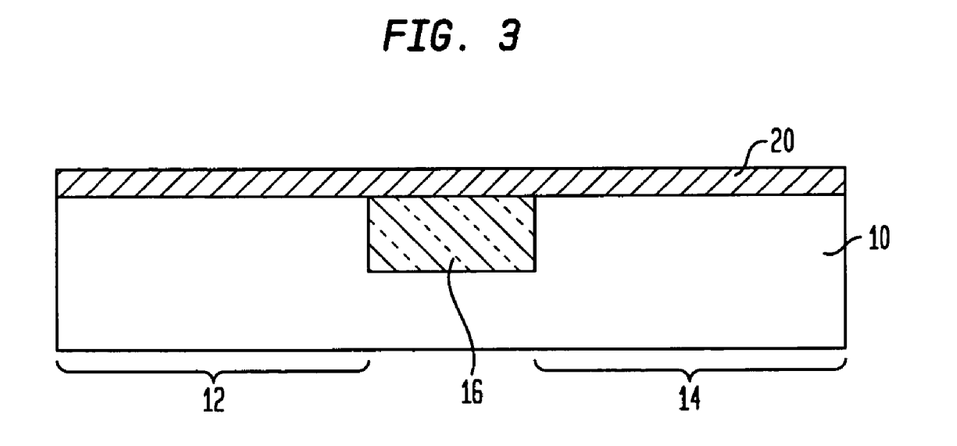

A metal alloy layer 20 is deposited over the semiconductor substrate 10, as shown in FIG. 3. The metal alloy layer 20 comprises nickel alloyed with at least one other metal. The total nickel content in the metal alloy layer 20 may range from about 50 to about 95 atomic %, with about 75 to 95 atomic % being more typical. The other metal(s) contained by the metal alloy layer 20 is preferably not more than about 50 atomic % but not less than about 5 atomic %, with about 0.1 to 20 atomic % being more typical.

Preferably, the metal alloy layer 20 comprises a nickel-platinum alloy, which can be formed by either depositing a mixture of nickel and platinum, or by first depositing a nickel layer and then incorporating platinum into the nickel layer. Platinum can be readily incorporated into the nickel layer by well-known techniques such as gas phase doping or ion implantation. The metal alloy layer 20 may further comprise one or more additional metals selected from the group consisting of Pd, Rh, Ti, V, Cr, Zr, Nb, Mo, Hf, Ta, W, Re, and combinations thereof. Preferably, the additional metal is Re. The metal alloy layer preferably has a thickness ranging from about 1 nm to about 40 nm, more preferably from about 2 nm to about 20 nm, and most preferably from about 5 nm to about 15 nm.

One or more capping layers (not shown) may be optionally deposited over the metal alloy layer 20. Such capping layer(s) comprises at least one material selected from the group consisting of Ti, TiN, W, WN, Ta, and TaN, and it functions to protect the metal alloy layer 20 as well as the silicide contacts to be formed from the metal alloy layer 20.

Next, a first annealing step is carried out at a relatively low annealing temperature, which ranges from about 150° C. to about 500° C. using either a continuous heating regime or various ramp and soak heating cycles, for a duration ranging from about 1 second to about 1000 seconds. More preferably, the first annealing step is carried out at an annealing temperature ranging from about 200° C. to about 400° C. and for a duration ranging from about 5 seconds to about 500 seconds, and most preferably, it is carried out at an annealing temperature ranging from about 250° C. to about 350° C. and for a duration from about 10 seconds to about 100 seconds. In a particularly preferred embodiment, the first annealing step is initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10°C./second to about 20° C./second. Further, it is preferred that the first annealing step is terminated by lowering the surrounding temperature of the entire structure to below 100° C. within a time period from about 10 seconds to about 1000 seconds.

Figure 4:
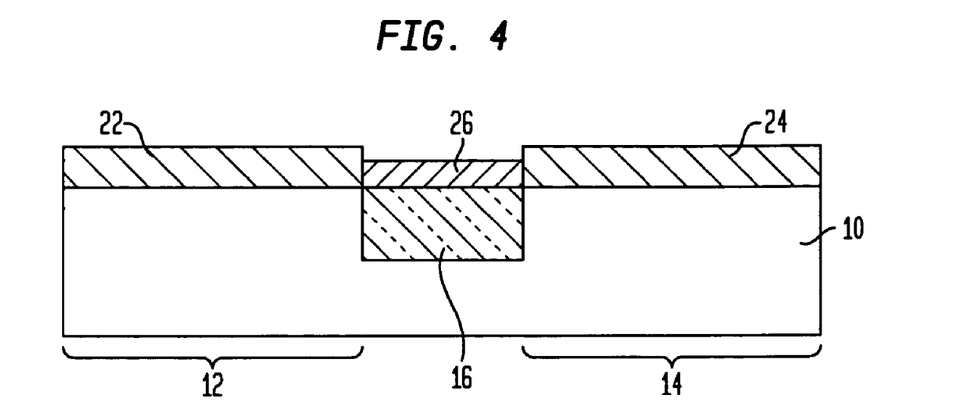

The first annealing step as described hereinabove is hereby referred to as a low-temperature rapid thermal annealing (RTA) step. As a result of such a low-temperature RTA step, nickel contained in the portions of the metal alloy layer 20 that are located directly over the first and second device regions 12 and 14 of the semiconductor substrate 10 react with silicon contained in the device regions 12 and 14 to form self-aligned silicide contacts 22 and 24, while the portion 26 of the metal alloy layer 20, which is located directly over the dielectric isolation region 16, contains unreacted nickel, as shown in FIG. 4. The self-aligned silicide contacts 22 and 24 contain at least $Ni_2Si$, which is formed by reaction between nickel and silicon at the relatively low annealing temperature and is characterized by a relatively higher resistivity in comparison with NiSi. The self-aligned silicide contacts 22 and 24 further contain platinum, which cannot react with silicon to form silicide at the low annealing temperature.

Figure 5:
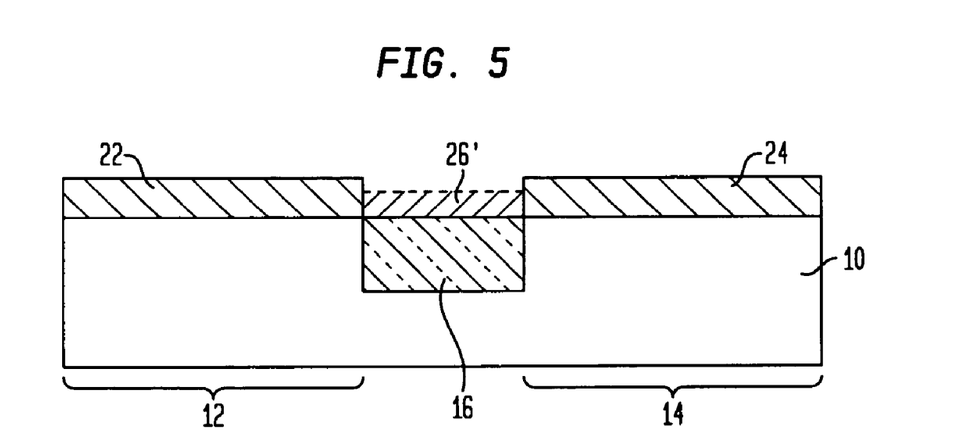

After the low-temperature RTA step, a nickel-only etching step is carried out to remove substantially all un-reacted nickel, but not the un-reacted platinum, from the portion 26 of the metal alloy layer 20 that is located directly over the dielectric isolation region 16, to form a portion 26' that contains only residual platinum stringers, as shown in FIG. 5. Such nickel-only etching step does not remove nickel silicide (i.e., $Ni_2Si$ at this point) from the self-aligned silicide contacts 22 and 24. Therefore, the self-aligned silicide contacts 22 and 24 remain substantially intact.

Preferably, the nickel-only etching step is carried out by using an etching solution that contains one or more oxidizers selected from the group consisting of hydrogen peroxide, sulfuric acid, potassium permanganate, ferric chloride, persulfate (e.g., ammonium persulfate, sodium persulfate, or potassium persulfate), nitric acid, a ceric compound (such as, for example, ceric ammonium nitrate), etc. In a preferred embodiment of the present invention, the nickel-only etching step is carried out using a solution that contains from about 1% to 30% by volume of hydrogen peroxide and from about 10% to about 90% by volume of sulfuric acid.

Subsequently, a second annealing step is carried out at a relatively high annealing temperature, which ranges from about 300° C. to about 600° C. using either a continuous heating regime or various ramp and soak heating cycles, for a duration ranging from about 1 second to about 600 seconds. More preferably, the first annealing step is carried out at an annealing temperature ranging from about 350° C. to about 550° C. and for a duration ranging from about 5 seconds to about 500 seconds, and most preferably, it is carried out at an annealing temperature ranging from about 400° C. to about 500° C. and for a duration from about 10 seconds to about 100 seconds. In a particularly preferred embodiment, the second annealing step is initiated by raising the surrounding temperature of the entire structure from ambient temperature to the desired annealing temperature at a ramp rate from about 1° C./second to about 35° C./second, more preferably from about 5° C./second to about 25° C./second, and most preferably from about 10° C./second to about 20° C./second. Further, it is preferred that the second annealing step is terminated by lowering the surrounding temperature of the entire structure to below 100° C. within a time period from about 10 seconds to about 600 seconds.

Figure 6:
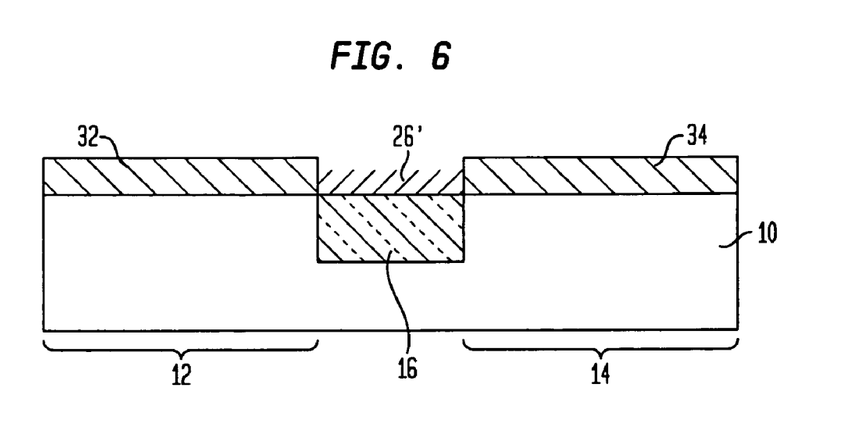

The second annealing step as described hereinabove is hereby referred to as a high-temperature rapid thermal annealing (RTA) step. As a result of such a high-temperature RTA step, $Ni_2Si$ contained in the self-aligned silicide contacts 22 and 24 further reacts with silicon in the first and second device regions 12 and 14 of the semiconductor substrate 10 to form completely silicidated and self-aligned contacts 32 and 34 (as shown in FIG. 6), which contain NiSi that is characterized by a relatively lower resistivity than $Ni_2Si$. Further, the unreacted platinum contained in the self-aligned silicide contacts 22 and 24 reacts with silicon in the first and second device regions 12 and 14 at the high annealing temperature, to form platinum silicide in the contacts 32 and 34, while the platinum stringers contained by the portion 26' located directly over the dielectric isolation region 16 remain unreacted (due to lack of silicon in the region 16), as shown in FIG. 6.

After the high-temperature RTA step, a second etching step is carried out to remove substantially all the unreacted platinum stringers contained by the portion 26' in selection over the NiSi and PtSi contained by the self-aligned silicide contacts 32 and 34, thereby exposing the dielectric isolation region 16 but without damaging the self-aligned silicide contacts 32 and 34.

The second etching step is carried out by using an etching solution that contains at least one oxidizing agent, at least one complexing agent, and at least one solvent. The molar ratio of the oxidizing agent(s), the complexing agent(s), and the solvent(s) in the second etching solution preferably ranges from about 1:10:200 to about 1:1:5.

The at least one oxidizing agent used in the second etching step can be selected from the group consisting of nitric acid, hydrogen peroxide, potassium permanganate, sodium persulfate, ammonia persulfate, potassium persulfate, ceric ammonium nitriate, potassium monopersulfate, etc. More preferably, the oxidizing agent is nitric acid.

The at least one complexing agent functions to form a complex with noble metal ions, such as platinum ions or gold ions, so as to facilitate etching of the noble metal(s). Preferably, such a complexing agent comprises halogen ions from at least one compound selected from the group consisting of sodium chloride, hydrochloric acid, sodium iodide, potassium iodide, sodium bromide, and potassium bromide. More preferably, the complexing agent comprises hydrochloric acid.

The at least one solvent contained by the second etching solution can be either a polar solvent or a non-polar solvent, and preferably the solvent contains at least water.

In a preferred embodiment of the present invention, the second etching solution is an aqua regia (AR) solution that comprises nitric acid as the oxidizing agent, hydrochloric acid as the complexing agent, and water as the solvent. More preferably, the AR solution comprises from about 40% to about 80% by volume of nitric acid, from about 20% to about 60% by volume of hydrochloric acid, and the remaining balance of water.

The second etching step is preferably carried out at an etching temperature ranging from about 30° C. to about 80° C. for a duration ranging from about 3 minutes to about 45 minutes. More preferably, the second etching step is carried out at an etching temperature ranging from about 35° C. to about 45° C. for a duration of from about 15 minutes to about 45 minutes. Prior to the etching (i.e., prior to the contact of the etching solution with the structure to be etched), it is preferred that the etching solution is maintained at an elevated temperature from about 30° C. to about 80° C. for a duration of at least about 10 minutes, more preferably at lest about 15 minutes. Further, after the etching (i.e., after removal of the structure from the etching solution), it is preferred that the structure is rinsed and then dried to remove trace amount of the etching solution.

The second etching step effectively removes substantially all the unreacted platinum stringers from the upper surface of the dielectric isolation region 16, without attacking or otherwise damaging the NiSi and PtSi contained by the silicide contacts 32 and 34.

Note that both the first and second annealing steps are preferably carried out in a gas atmosphere, e.g., He, Ar, $N_2$ or forming gas. They may be carried out in different atmospheres or in the same atmosphere. For example, He may be used in both annealing steps, or He can be used in the first annealing step and a forming gas may be used in the second annealing step.

One unique aspect of the present invention is the use of two different etching solutions in two separate etching steps to remove the unreacted silicide metals (i.e., nickel and platinum). The first etching step, which follows the low-temperature RTA step, removes the bulk amount of the unreacted nickel from the upper surface of the dielectric isolation region 16. The second, more aggressive etching step, which follows the high-temperature RTA step, then removes the platinum stringers or other hard-to-remove alloying metal(s) from the upper surface of the dielectric isolation region 16. More importantly, the high-temperature RTA step, which proceeds the second etching step, functions to effectively convert the metals contacted by the silicide contacts 32 and 34 over the device regions 12 and 14 into complete silicide (such as NiSi and PtSi) that are resistant to attacks by the second etching step.

Figure 7:
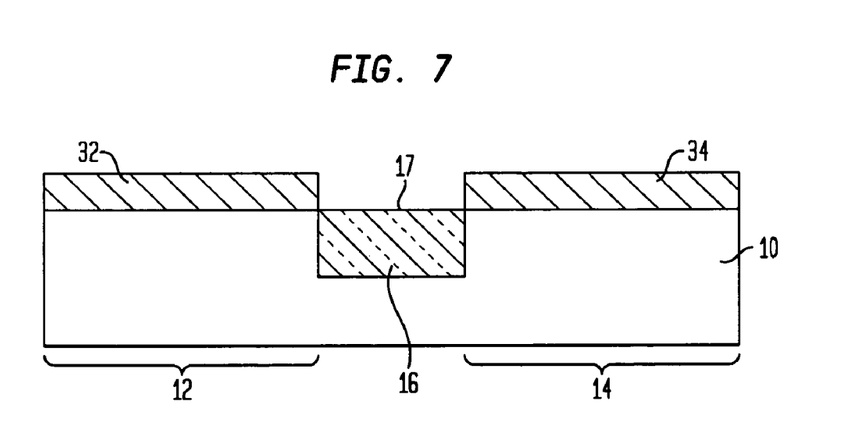

Correspondingly, the exposed dielectric isolation region 16 is essentially free of metal and metal silicide, while the self-aligned silicide contacts 32 and 34 are substantially undamaged and are characterized by a substantially smooth surface morphology (i.e., having surface protrusions and/or recesses of less than 1 nm in height), as shown in FIG. 7.

The second etching step as described hereinabove can also be used separately (i.e., independent of the RTA steps and the first etching step) for selective etching of nickel-platinum alloy over nickel silicide and platinum silicide. Specifically, an etching bath comprising at least one oxidizing agent, at least one complexing agent, and at least one solvent, as described hereinabove, is first provided and maintained at an elevated temperature ranging from about 30° C. to about 80° C. for at least 15 minutes. Next, a work piece that comprises nickel-platinum alloy, nickel silicide, and platinum silicide is contacted with the etching bath at an etching temperature ranging from about 30° C. to about 80° C. for a duration of from about 10 to about 45 minutes. Thereafter, the work piece is removed from the etching bath, and then rinsed and dried to remove traces of the etchants from the work piece.

It is important to note that although the description hereinabove is focused primarily on formation of metal silicides on a silicon substrate 10, it is readily understood that the substrate 10 may also comprise silicon-containing semiconductor alloys (eg., SiGe or SiC) for formation of other metal-semiconductor alloys (e.g., NiGe, NiC, PtGe, and/or PtC) in conjunction with the metal silicides. For example, when SiGe is used as the substrate material in the semiconductor substrate 10, NiGe will be formed together with NiSi. The methods of the present invention are equally applicable to such semiconductor alloys.

While FIGS. 2-7 illustratively demonstrates exemplary processing steps that can be used to form self-aligned silicide contacts isolated from each other by an exposed dielectric region, according to a specific embodiment of the present invention, it is clear that a person ordinarily skilled in the art can readily modify such processing steps for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a semiconductor structure comprising:
    providing a semiconductor substrate including a first device region comprising a silicon-containing semiconductor material, a second device region comprising said silicon-containing semiconductor material, and a dielectric isolation region laterally abutting said first device region and said second device region and located in said semiconductor substrate;
    forming a metal alloy layer over said first device region and said second device region and said dielectric isolation region, wherein said metal alloy layer comprises nickel and at least one additional metal;
    annealing at a first annealing temperature ranging from about 150° C. to about 500° C., wherein nickel contained in said metal alloy layer reacts with silicon contained in said first device region and said second device region to form nickel silicide of a first phase over said first device region and said second device region, wherein said first annealing temperature is selected so that said at least one additional metal in said metal alloy layer does not react with silicon contained in said first device region and said second device region to form a silicide of said at least one additional metal and remains as an unreacted at least one additional metal within said nickel silicide of said first phase;
    selectively etching said metal alloy layer using a first etching solution to remove substantially all un-reacted nickel from said dielectric isolation region between said first device region and said second device region, wherein said unreacted at least one metal remains over said dielectric isolation region;
    annealing at a second annealing temperature ranging from about 300° C. to about 600° C., wherein said nickel silicide of said first phase further reacts with silicon contained in said first device region and said second device region to form nickel silicide of a second phase over said first device region and said second device region, wherein the second phase has a lower resistivity than the first phase, and wherein said second annealing temperature is selected so that said unreacted at least one additional metal in said nickel silicide of said first phase reacts with silicon contained in said first device region and said second device region to form a silicide of said at least one additional metal within said nickel silicide of said second phase during formation of said nickel silicide of said second phase; and
    selectively etching stringers of said at least one additional metal using a second etching solution to remove substantially all of said at least one additional metal from an upper surface of said dielectric isolation region, thereby forming self-aligned metal silicide contacts that are electrically isolated from each other.

2. The method of claim 1, wherein said first device region and said second device region comprise at least one of undoped Si, n-doped Si, p-doped Si, single crystal Si, polycrystalline Si, amorphous Si, SiGe, SiGeC, and combinations thereof.

3. The method of claim 1, wherein said metal alloy layer comprises a nickel-platinum alloy.

4. The method of claim 3, wherein said at least one additional metal is selected from the group consisting of Pd, Rh, Ti, V, Cr, Zr, Nb, Mo, Hf, Ta, W, Re, and combinations thereof.

5. The method of claim 4, wherein said at least one additional metal is Re.

6. The method of claim 1, wherein said metal alloy layer comprises from about 50 to about 95 atomic % of nickel, and up to about 50 atomic % of said at least one additional metal.

7. The method of claim 1, wherein said metal alloy layer has a thickness ranging from about 1 nm to about 40 nm.

8. The method of claim 1, further comprising forming a capping layer over said metal alloy layer prior to annealing at said first temperature.

9. The method of claim 8, wherein said capping layer comprises at least one material selected from the group consisting of Ti, TiN, W, WN, Ta and TaN.

10. The method of claim 1, wherein said first etching solution comprises at least one of a peroxide-sulfuric acid solution, a fete chloride solution, an ammonium persulfate solution, a nitric acid solution, and a eerie solution.

11. The method of claim 1, wherein said second etching solution comprises at least one oxidizing agent, at least one complexing agent, and at least one solvent, and wherein said stringers of said at least one additional metal are contacted with said second etching solution at an etching temperature ranging from about 30° C. to about 80° C. for a duration ranging from about 3 minutes to about 45 minutes, wherein substantially all of said stringers of said at least one additional metal are removed from said dielectric isolation region.

12. The method of claim 11, wherein said stringers of said at least one additional metal are contacted with said second etching solution at an etching temperature ranging from about 35° C. to about 45° C. for a duration of from about 15 minutes to about 45 minutes.

13. The method of claim 11, wherein said at least one oxidizing agent, said at least one complexing agent, and said at least one solvent are present in a molar ratio from about 1:10:200 to about 1:1:5.

14. The method of claim 11, wherein said at least one oxidizing agent comprises at least one selected from the group consisting of nitric acid, hydrogen peroxide, potassium permanganate, sodium persulfate, ammonia persulfate, potassium persulfate, eerie ammonium nitrate, and potassium monopersulfate.

15. The method of claim 11, wherein said at least one oxidizing agent comprises nitric acid.

16. The method of claim 11, wherein said at least one complexing agent comprises halogen ions from at least one compound selected from the group consisting of sodium chloride, hydrochloric acid, sodium iodide, potassium iodide, sodium bromide, and potassium bromide.

17. The method of claim 11, wherein said at least one complexing agent comprises hydrochloric acid.

18. The method of claim 11, wherein said at least one solvent comprises a polar solvent or a non-polar solvent.

19. The method of claim 11, wherein said at least one solvent comprises water.

20. The method of claim 11, wherein said at least one oxidizing agent comprises nitric acid, said at least one complexing agent comprises hydrochloric acid, and said at least one solvent comprises water.

21. The method of claim 1, wherein each of said self-aligned metal silicide contacts has a sheet resistance ranging from about 15 ohms/square to about 45 ohms/square.

22. The method of claim 1, wherein said self-aligned metal silicide contacts are each characterized by a thickness ranging from about 10 nm to about 50 nm.

* * * * *